(12) United States Patent
Rosenblatt

(10) Patent No.: US 8,641,826 B2
(45) Date of Patent: Feb. 4, 2014

(54) COATER PLATTER HOMING TOOL

(75) Inventor: James S. Rosenblatt, Houston, TX (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 13/484,457

(22) Filed: May 31, 2012

(65) Prior Publication Data

US 2012/0233870 A1  Sep. 20, 2012

Related U.S. Application Data

(62) Division of application No. 12/202,499, filed on Sep. 2, 2008, now Pat. No. 8,211,234.

(51) Int. Cl.
*C23C 16/00* (2006.01)

(52) U.S. Cl.
USPC .......................................................... 118/730

(58) Field of Classification Search
USPC ............... 118/500, 728, 729, 730; 29/271; 204/298.01, 298.02, 298.23, 298.28; 156/345.51, 345.54, 345.55
See application file for complete search history.

(56) References Cited

U.S. PATENT DOCUMENTS

| 3,015,883 | A | 1/1962 | Brown |
| 5,269,896 | A | 12/1993 | Munemasa |
| 5,282,944 | A | 2/1994 | Sanders |
| 5,363,400 | A | 11/1994 | Damond |
| 5,380,420 | A | 1/1995 | Tsuji |
| 5,803,971 | A * | 9/1998 | Menchetti et al. ............ 118/500 |
| 6,009,829 | A | 1/2000 | Ramalingam |
| 6,036,828 | A | 3/2000 | Beers |
| 6,172,374 | B1 | 1/2001 | Banks |
| 6,224,726 | B1 | 5/2001 | Beers |
| 6,770,178 | B2 | 8/2004 | Marszal |
| 6,974,503 | B2 | 12/2005 | Byrnes et al. |
| 7,153,367 | B2 | 12/2006 | Lindenberg et al. |
| 2005/0025899 | A1* | 2/2005 | Byrnes et al. ................ 427/448 |
| 2006/0124450 | A1 | 6/2006 | Beers |

FOREIGN PATENT DOCUMENTS

| GB | 1057765 | 2/1967 |
| WO | 02/27065 | 4/2002 |

OTHER PUBLICATIONS

European Search Report dated Feb. 4, 2010 (for parent U.S. Appl. No. 12/202,499).
Extended European Search Report dated Apr. 7, 2010 (for parent U.S. Appl. No. 12/202,499).

* cited by examiner

*Primary Examiner* — Maureen Gramaglia
(74) *Attorney, Agent, or Firm* — Carlson, Gaskey & Olds, PC

(57) ABSTRACT

An alignment tool is used to ensure proper alignment of a component on a rotating gear relative to a non-rotating platter. The alignment tool includes a first arm member coupled to a locating feature on the gear, and a second arm member that is coupled to the first arm member such that the second arm member is movable relative to the first arm member. When the first arm member is coupled to the locating feature, the second arm member locates off the platter to verify proper alignment. The second arm member is cannot be fitted to the platter when there is improper alignment.

19 Claims, 3 Drawing Sheets

COATER PLATTER HOMING TOOL

CROSS-REFERENCE TO RELATED APPLICATION

This application is a divisional of U.S. Ser. No. 12/202,499, filed Sep. 2, 2008, now U.S. Pat. No. 8,211,234.

BACKGROUND OF THE INVENTION

This disclosure relates to a homing tool for a coating platter and, more particularly, to a homing tool for a platter that supports turbine engine components for a coating process.

Certain gas turbine engine components are subject to a coating application during manufacture, such as a cathodic arc coating for example. A tooling fixture is used to support multiple components such that the coating is evenly applied over all desired areas. The tooling fixture includes a fixed platter and a large central gear that rotates relative to the platter. Several tooling sites with locating features are supported on the gear. The tooling sites and the central gear are connected in such a way that rotating the central gear about its axis will also rotate the tooling sites about their axis. Shielding is attached to the platter assembly for protective purposes. The tooling fixture and associated components are placed onto the tooling sites on the central gear. The platter is placed within the coater apparatus and the coating is applied.

In order to ensure that the components are fully and evenly coated, the gear must be "homed" or aligned properly. If the gear is not aligned properly prior to the coating process, then the tooling sites will not be in the correct position. As the cathodic arc coating process is a line of sight coating process, if the components are improperly aligned, deposition of the coating could be uneven.

One example of a tool that has been used to check alignment is a locating plate. To check whether there is proper alignment, the shielding is removed and then the locating plate is bolted into place. The locating plate includes three holes. One hole is to be aligned with a hole in the gear, and the other two holes are to be aligned with two holes in the platter. If all of the corresponding holes are in alignment with each other, then the platter is supposedly homed. However, if the gear has been rotated 180 degrees, the locating plate will still fit on the platter and the gear but the homing is incorrect and the tooling sites and thus the components are not in the correct position on the gear.

Another disadvantage with the use of the locating plate is that the shielding must be removed prior to attachment of the locating plate. As such, this homing operation cannot be accomplished between coating runs due to the high heat that the tooling fixture components are subjected to during the coating process. To perform the homing operation, the tooling fixture components need to cool sufficiently such that all of the shielding can be removed, then the platter is removed from the coating machine, and then the locating plate is mounted to the platter and the gear to check for alignment. This alignment check process could take over 30 minutes to perform.

Accordingly, there is a need for a method and apparatus to check for proper alignment that addresses the problems identified above.

SUMMARY OF THE INVENTION

An alignment tool is used to ensure proper alignment of a tooling site on a rotating gear relative to a non-rotating platter. In one example, at least one component is associated with each tooling site on the gear to receive a coating application.

The alignment tool includes a first arm member coupled to a locating feature associated with the tooling site on the gear, and a second arm member that is coupled to the first arm member such that the second arm member is pivotable relative to the first arm member. When the first arm member is coupled to the locating feature, the second arm member is pivoted to locate off of the platter to verify proper alignment of the tooling site. The second arm member cannot be fitted around a front feature found on a front portion of the platter or underneath a bottom surface when there is improper alignment.

In one example, the first arm member and the second arm member are coupled together with a hinge connection.

In one example, the first arm member includes a socket that is coupled to the locating feature, and the second arm member includes first and second arms that are fitted underneath the platter to verify alignment.

A method for verifying alignment includes the steps of coupling the first arm portion to the locating feature for the tooling site on the rotating gear, pivoting the second arm portion relative to the first arm portion to locate off a bottom surface of the platter, and identifying proper alignment of the tooling site when the second arm portion is fitted underneath the platter and around the front feature. Improper alignment of the tooling site can be identified when the second arm portion will not fit underneath the platter and around the front feature.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

DETAILED DESCRIPTION

Figure 1:
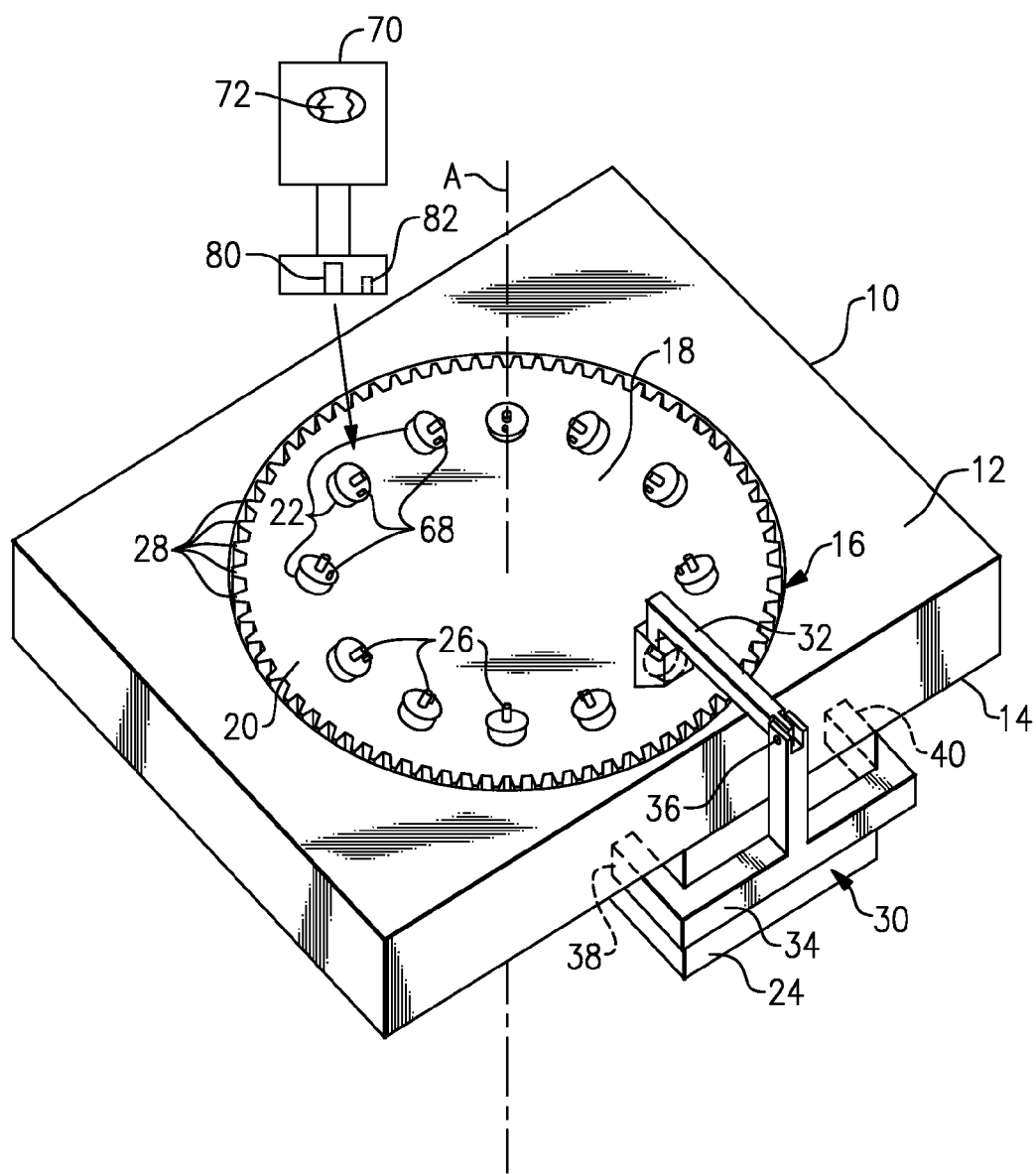
FIG. 1 is a schematic representation of an alignment tool for a tooling fixture.

FIG. 1 shows a platter 10 that comprises a non-rotating structure having an upper surface 12 and a lower surface 14. A recess 16 is formed within the upper surface 12. A gear 18 is received within the recess 16 for rotation about an axis A.

The gear 18 includes a gear body with an upper surface 20 having a plurality of tooling sites 22 that are to receive tooling fixtures 70 that contain and mask a component 72 for a coating application. In one example, the components 72 comprise turbine engine components. A main locating pin 26 and a secondary locating pin 68 are associated with each tooling site 22, with both locating pins 26, 68 being associated with at least one of the tooling fixtures 70. A plurality of gear teeth 28 are formed about an outer circumference of the gear body.

During a coating application for the engine components, a mechanism (not shown) drives the gear teeth 28 to rotate the tooling sites 22 and the associated components 72 such that a coating can be fully and evenly applied to desired areas. In one example, the platter 10, gear 18, and associated components 72 are subjected to a cathodic arc coating process. The cathodic arc coating process is a well known process and will not be discussed in further detail.

As known, cathodic arc coating is a line of sight coating process so it is important that the rotating gear 18 with its associated tooling sites 22 be aligned or "homed" properly relative to the non-rotating platter 10. To verify proper alignment, the gear 18 is first rotated around is axis A so that a particular tooling site 22 is in a front middle position. An alignment tool 30 is coupled with a locating feature for this tooling site 22, i.e. pins 26 and 68, and a front locating feature 24 on a front of the platter 10.

As shown in FIG. 1, the alignment tool 30 includes a first arm portion 32 that is associated with one set of locating pins 26, 68 and a second arm portion 34 that is pivotally mounted to the first arm portion 32. Although a pivotal connection is shown, it should be understood that other types of connections that allow relative movement between the first 32 and second 34 arm portions could also be used. In one example, the second arm portion 34 is coupled to the first arm portion 32 with a hinge connection 36. The second arm portion 34 includes first 38 and second 40 arms that are located off the lower surface 14 of the platter 10. When the locating pins 26, 68 are properly aligned relative to the platter 10, the first 38 and second 40 arms will fit around the front locating feature 24. If the locating pins 26, 68 are improperly aligned, the hinged arm portion, i.e. the first 38 and second 40 arms will not fit around the front locating feature 24.

Figure 2:
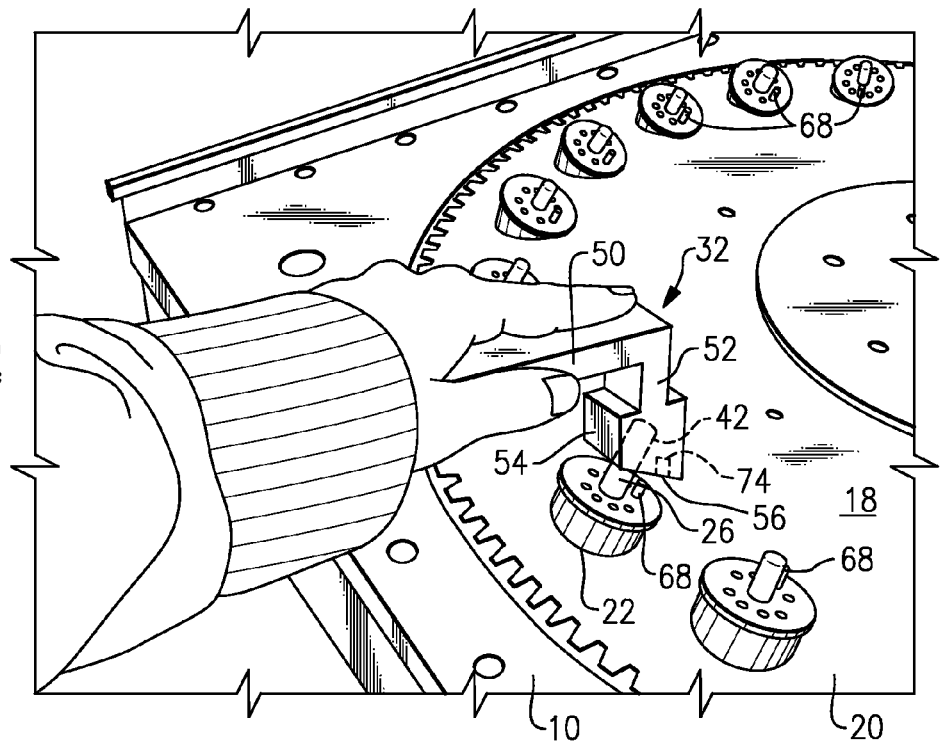
FIG. 2 shows an initial step for verifying alignment.
Figure 3:
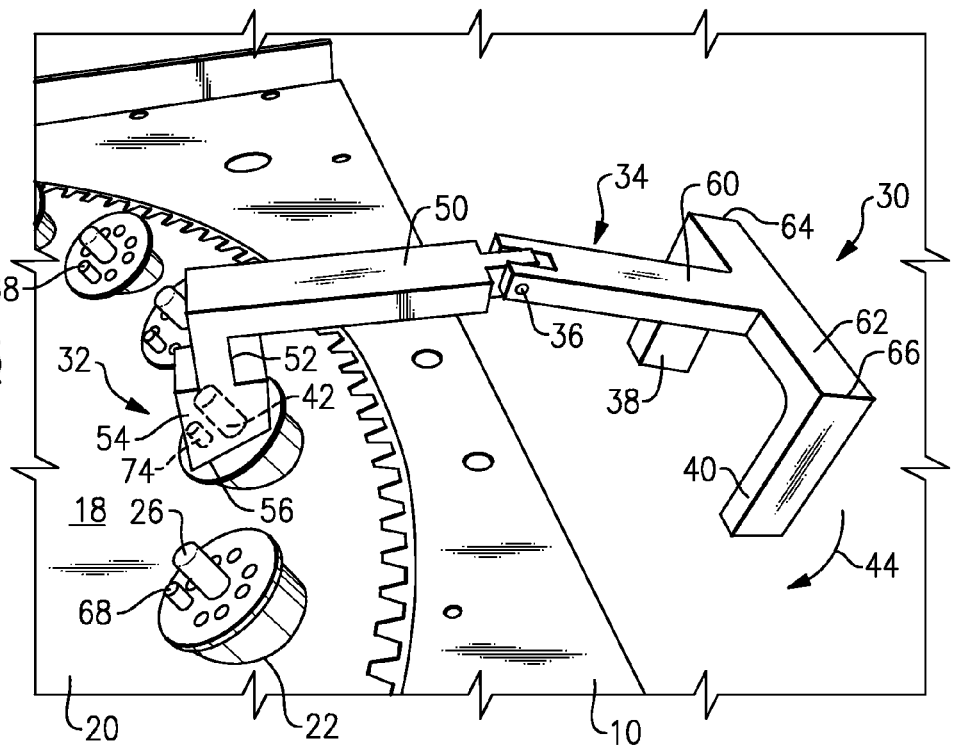
FIG. 3 shows an intermediate step for verifying alignment.
Figure 4:
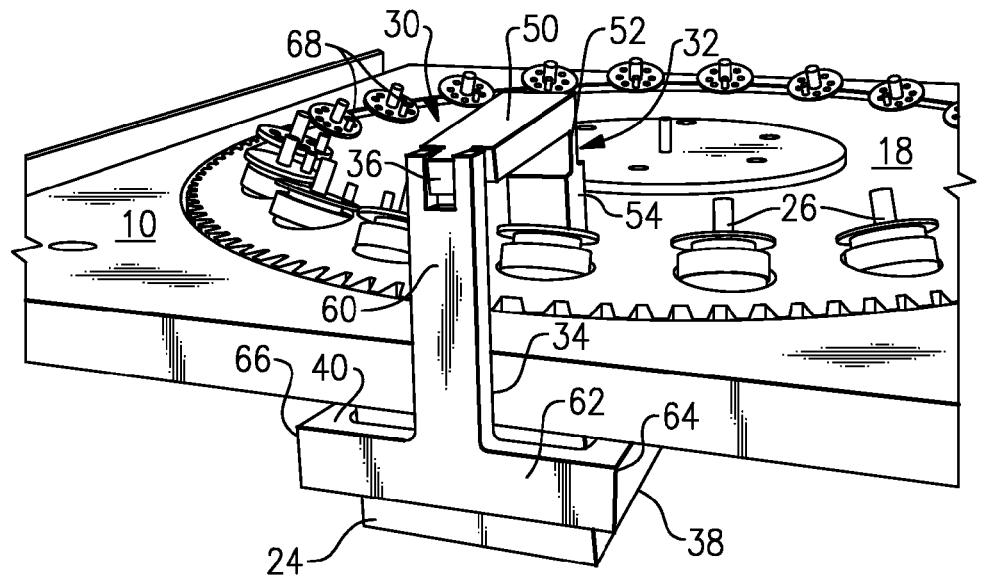
FIG. 4 shows a final step for verifying alignment.
Figure 5:
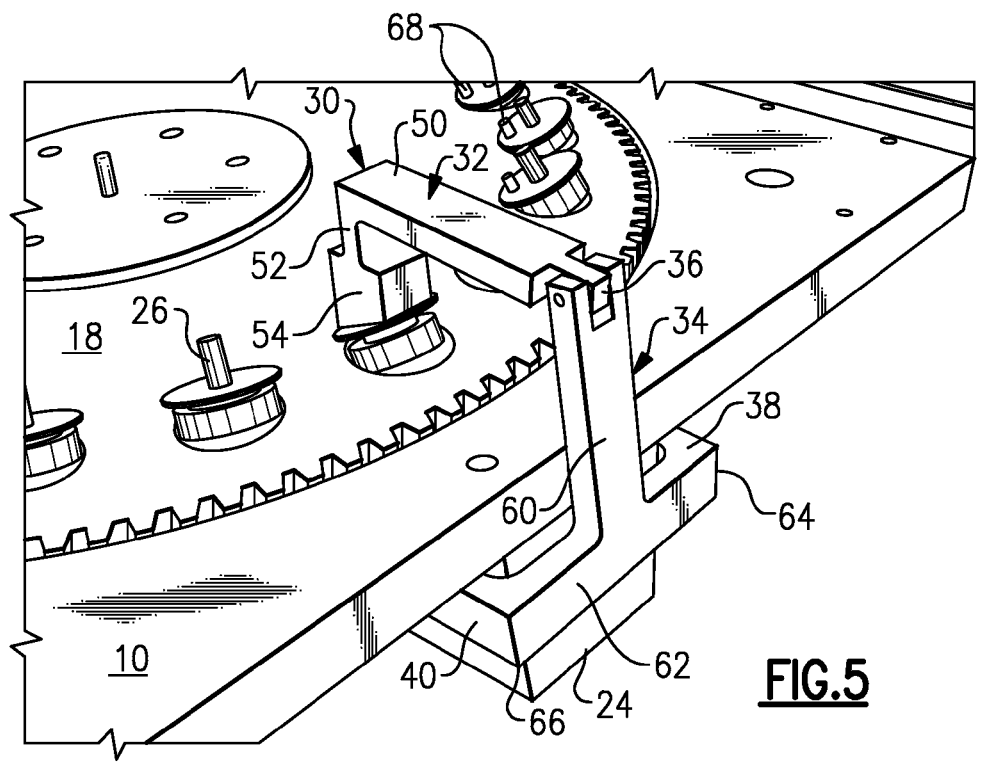
FIG. 5 shows the alignment tool in a final installation position.

The operation of the alignment tool 30 is shown in greater detail in FIGS. 2, 3, 4, and 5. As shown in FIG. 2, the first arm portion 32 includes a main socket 42 that is fitted over the main locating pin 26 and a secondary socket 74 that is fitted over the secondary locating pin 68. As shown, the sockets 42, 74 are fitted onto the locating pins 26, 68 that are closest to the front edge of the platter 10. Once the sockets 42, 74 are fitted on the locating pins 26 and 68, the second arm portion 34 is pivoted downwardly relative to the first arm portion 32 as shown at arrow 44 in FIG. 3. The second arm portion 34 is pivoted downwardly so that both the first 38 and second 40 arms can be fitted or located around the front locating feature 24 as shown in FIGS. 4 and 5. Alternatively, platter 10 can have recesses in the side into which first 38 and second 40 arm portions can register. If the locating pins 26 and 68 are improperly aligned, the second arm portion 34 will not be able to be pivoted into the position as shown in FIGS. 4 and 5.

As shown in FIG. 3, the first arm portion 32 includes a first linear body portion 50 and a second linear body portion 52 that extends transversely relative to the first linear body portion 50. In one example, the first 50 and second 52 linear body portions are perpendicular to each other. The second linear body portion 52 includes an enlarged head portion 54 that includes the sockets 42, 74.

In the example shown, the locating pins 26, 68 are obliquely orientated relative to the upper surface 20 of the gear 18. As such, a distal end surface 56 of the enlarged head portion 54 is tapered to facilitate insertion onto the locating pins 26, 68. When the socket 42 is fitted over the locating pins 26 and 68, the first linear body portion 50 is generally parallel to the upper surface 20 of the gear 18 with the second linear body portion 52 extending downwardly toward the upper surface 20.

As shown in FIG. 3, the second arm portion 34 includes a first linear body portion 60 and a second linear body portion 62 that extends transversely relative to the first linear body portion 50. In one example, the first 60 and second 62 linear body portions are perpendicular to each other such that the second arm 34 portion has a T-shape. The second linear body portion 62 includes first 64 and second 66 opposing ends. The first arm 38 of the second arm portion 34 extends transversely relative to the first opposing end 64 and the second arm 40 extends transversely relative to the second opposing end 66. In this example configuration, the second linear body portion 62 and the first 38 and second 40 arms cooperate to form a C-shape.

When the sockets 42, 74 are fitted over the locating pins 26 and 68, and when the second arm portion 34 is pivoted to the position shown in FIGS. 4 and 5, the first linear body portion 50 of the first arm portion 32 is generally perpendicular to the first linear body portion 60 of the second arm portion 34. Also as shown in FIGS. 4 and 5, when in a proper alignment position, the first 38 and second 40 arms are generally parallel to the first linear body portion 50 of the first arm portion 32.

The example alignment tool 30 can verify alignment in a significantly shorter amount of time than with prior homing or alignment tools because the platter does not have to be removed from the coater apparatus and the shielding does not have to be removed. Further, the platter 10 is homed off of the position of the locating pins 26, 68 for the tooling sites 22 as opposed to a location of the gear, which eliminates the possibility of misalignment or homing error.

Once properly aligned, tooling fixtures 70 that contain and mask the components 72 can then be positioned at each tooling site 22 such that the components 72 can be coated. Each tooling fixture 70 includes sockets 80, 82 (FIG. 1) that receive the locating pins 26, 68 at the tooling sites 22 to support the tooling fixture 70.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. An alignment tool comprising:
   a first arm member associated with at least one locating feature supported on a gear that rotates relative to a platter, the at least one locating feature to locate a component on the gear; and
   a second arm member coupled to said first arm member wherein said second arm member is movable relative to said first arm member such that when said first arm member is coupled to the at least one locating feature, said second arm member is engageable with the platter to verify proper alignment of the component for a coating application.

2. The alignment tool according to claim 1 wherein said second arm member is coupled to said first arm member with a hinge connection.

3. The alignment tool according to claim 1 wherein the second arm member includes first and second arms that are axially spaced apart from each other, and wherein proper alignment is verified only when both said first and said second arms are fitted around a front locating feature associated with the platter.

4. The alignment tool according to claim 3 wherein improper alignment is identified when said first and said second arms cannot be pivoted to fit around the front locating feature.

5. The alignment tool according to claim 1 wherein said first arm member includes at least one socket that is received over the at least one locating feature.

6. The alignment tool according to claim 1 wherein said second arm member is to engage an underside of the platter.

7. The alignment tool according to claim 1 wherein said second arm member is coupled to said first arm member with a hinge connection, and wherein the second arm member includes first and second arms that are axially spaced apart from each other.

8. The alignment tool according to claim 7 wherein said second arm member includes a first linear body portion and a second linear body portion that is transverse to said first linear body portion, and wherein said first linear body portion is coupled to said first arm member with said hinge connection, and wherein said first and said second arms are located at opposing ends of said second linear body portion.

9. The alignment tool according to claim 8 wherein said first and said second arms extend transversely to said second linear body portion.

10. The alignment tool according to claim 9 wherein said at least one locating feature comprises at least one locating pin for each tooling site, and wherein said first arm member includes at least one socket to receive said at least one locating pin.

11. The alignment tool according to claim 10 wherein, when said socket is coupled to said locating pin and said second arm member is in engagement with said platter, said first and said second arms are spaced apart from said first arm member and are parallel to said first arm member.

12. The alignment tool according to claim 11 wherein said at least one locating pin comprises first and second locating pins for each tooling site and wherein said first arm member includes first and second sockets that are received over said first and second locating pins, and wherein proper alignment is verified only when both said first and said second arms are fitted around a front locating feature associated with the platter.

13. The alignment tool according to claim 9 wherein said first linear body portion extends generally in a vertical direction and said second linear body portion extends generally in a horizontal direction, with said first and said second arms extending from said second linear body portion to form a C-shape.

14. The alignment tool according to claim 1 wherein said platter comprises a generally flat upper surface with a recess for receiving said gear, and wherein said gear includes a gear body that rotates about an axis, said gear body including a plurality of gear teeth formed about an outer circumference, and wherein said locating features are circumferentially spaced apart from each other on an upper surface of said gear body about said axis.

15. The alignment tool according to claim 1 wherein said component comprises a turbine engine component.

16. The alignment tool according to claim 1 wherein said first and said second arm members are directly coupled to each other.

17. The alignment tool according to claim 1 wherein said at least one locating feature comprises at least a main locating feature and a secondary locating feature that define a proper position of the component.

18. The alignment tool according to claim 1 wherein when said first arm member is coupled to the at least one locating feature, said second arm member is moved relative to said first arm member to verify proper alignment.

19. The alignment tool according to claim 18 wherein said second arm member is rotated relative to said first arm member from an initial position where said second arm member is disengaged from the platter to a platter fitted position where said second arm is engaged with the platter in proper alignment;
wherein when said first arm member is coupled to the at least one locating feature and said second arm member is incapable of being moved from said initial position to said platter fitted position there is improper alignment; and
wherein when said first arm member is coupled to the at least one locating feature and said second arm member is capable of being moved from said initial position to said platter fitted position there is proper alignment.

* * * * *